(12) United States Patent
Choi et al.

(10) Patent No.: US 8,976,593 B2
(45) Date of Patent: Mar. 10, 2015

(54) NONVOLATILE SEMICONDUCTOR DEVICE

(75) Inventors: Dae-Il Choi, Gyeonggi-do (KR); Jin-Su Park, Gyeonggi-do (KR); Byoung-Sung Yoo, Gyeonggi-do (KR); Jae-Ho Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 227 days.

(21) Appl. No.: 13/453,152

(22) Filed: Apr. 23, 2012

(65) Prior Publication Data

US 2012/0268997 A1 Oct. 25, 2012

(30) Foreign Application Priority Data

Apr. 21, 2011 (KR) ........................ 10-2011-0037185

(51) Int. Cl.
*G11C 16/04* (2006.01)
*G11C 16/24* (2006.01)
*G11C 16/30* (2006.01)

(52) U.S. Cl.
CPC ............ *G11C 16/0483* (2013.01); *G11C 16/24* (2013.01); *G11C 16/30* (2013.01)
USPC .................. 365/185.18; 365/185.02

(58) Field of Classification Search
None
See application file for complete search history.

(56) References Cited

U.S. PATENT DOCUMENTS

| 2007/0121388 | A1* | 5/2007 | Lee ......................... 365/185.29 |
| 2009/0003067 | A1* | 1/2009 | Kang et al. .............. 365/185.13 |
| 2010/0054074 | A1* | 3/2010 | Ryu .......................... 365/233.1 |

FOREIGN PATENT DOCUMENTS

KR 1020080114251 12/2008

OTHER PUBLICATIONS

Office Action issued by the Korean Intellectual Property Office on Sep. 27, 2012.

* cited by examiner

*Primary Examiner* — James G Norman
(74) *Attorney, Agent, or Firm* — IP & T Group LLP

(57) ABSTRACT

A nonvolatile memory device includes a plurality of global word lines, a voltage pump configured to generate a plurality of voltages, a control unit configured to divide the plurality of global word lines into a first group and a second group in response to an input row address and generate control signals, a first selection unit configured to output at least two different voltages that are to be applied to global word lines of the first group, a second selection unit configured to output a voltage that is to be applied to global word lines of the second group, and a third selection unit configured to apply output voltages of the first selection unit to the global word lines of the first group, and apply an output voltage of the second selection unit to the global word lines of the second group.

20 Claims, 7 Drawing Sheets

NONVOLATILE SEMICONDUCTOR DEVICE

CROSS-REFERENCE TO RELATED APPLICATIONS

The present application claims priority of Korean Patent Application No. 10-2011-0037185, filed on Apr. 21, 2011, which is incorporated herein by reference in its entirety.

BACKGROUND

1. Field

Exemplary embodiments of the present invention relate to a nonvolatile semiconductor device, and more particularly, to a circuit for controlling a global word line in a nonvolatile semiconductor device.

2. Description of the Related Art

A semiconductor memory device is classified as volatile memory and nonvolatile memory according to whether data is retained when power is not supplied. A nonvolatile memory such as a flash memory is capable of recording and deleting data freely and retaining stored data without the supply of power. Specifically, since a NAND flash memory has a high degree of integration, the NAND flash memory has been widely used in various application fields for high capacity data storage.

In such a nonvolatile memory, it is necessary to perform an electrical erase and reprogramming process with respect to a designated unit of memory cells in order to change previously programmed data, differently from a volatile memory such as a dynamic random access memory (DRAM). More specifically, in order to program data in a memory cell in an initialized state and then change the data, a designated number of memory cells including the selected memory cell may be reinitialized through an electrical erase operation and subsequently the selected memory cell may be reprogrammed with the changed content. In general, a unit of memory cells performing the electrical erase is called a block, and a unit of memory cells performing data record, or more specifically, program, is called a page. Here, the "page" indicates a set of memory cells connected to one word line, and one block includes a plurality of (for example, 64 or 128) pages.

FIG. 1A is a diagram illustrating a part of a memory cell array of an NAND flash memory device.

Referring to FIG. 1A, a cell array of the NAND flash memory includes a plurality of cell strings 100 and 110, and the cell string 100 includes a plurality of memory cells serially connected to one another between a drain select transistor 101 and a source select transistor 103, and the cell string 110 includes a plurality of memory cells serially connected to one another between a drain select transistor 111 and a source select transistor 113. The drain select transistors 101 and 111 and the source select transistors 103 and 113 are connected to a drain select line DSL and a source select line SSL, respectively, and the memory cells in the cell strings 100 and 110 are connected to one another through a plurality of word lines WL<0> to WL<n>. The cell strings 100 and 110 are selectively connected to bit lines BL through the drain select transistors 101 and 111, and are selectively connected to a common source line CSL, which is connected to a ground voltage terminal, through the source select transistors 103 and 113. The cell strings 100 and 110 connected to the bit lines BL are connected in parallel to the common source line CSL, thereby forming one memory cell block.

To perform program, read, and erase operations in a NAND flash memory device, a bias voltage suitable is applied for each operation to a selected word line. For example, in a program operation, a program voltage (for example, 10 V or more) is applied to a word line selected by an input row address, and a pass voltage (for example, 10 V or less) is applied to remaining word lines. Meanwhile, as the capacity and integration degree of a memory device are increased, to reduce a disturbance phenomenon to an adjacent word line or a bit line (or a memory cell connected to the bit line), pass voltages at different voltage levels are applied to word lines within a designated distance from the word line selected in the program operation. The application of the pass voltages will be called a "boosting option."

FIG. 1B is a diagram illustrating voltages applied to the word lines of FIG. 1A in a program operation.

Referring to FIG. 1B, a program voltage VPGM is applied to a word line WL<A> selected by an input row address A in the program operation, and different voltages VBST1, VBST2 and VBST3 are applied to word lines WL<A+3> to WL<A+1> and WL<A−1> to WL<A−3> within a designated distance from the selected word line WL<A> according to the distance to the selected word line WL<A> because the above-mentioned boosting option is applied the word lines. On the other hand, a pass voltage VPASS is applied to remaining word lines WL<n> to WL<A+4> and WL<A−4> to WL<0>.

Since the number of word lines of a NAND flash memory may be 32 to 128 (gradually increased) per one block, and one NAND flash memory includes 1000 or more blocks, the total number of word lines is 32,000 or more at minimum. In order to select one of the 32,000 or more word lines and directly apply a bias voltage to the selected word line, switches corresponding to the total 32,000*(the number of voltage to be generated) are required, which makes the configuration of a chip difficult.

In order to solve such a problem, a global word line (GWL) is used. In a NAND flash memory, while one block is operating, other blocks do not operate. In this regard, a two-stage configuration scheme is used where a global word line is generated as a sample set of word lines provided in one block, a voltage used for each operation is first applied to the global word line, and subsequently transferred to word lines in each block.

FIG. 2 is a diagram illustrating a word line control circuit of an NAND flash memory device according to the conventional art, and FIGS. 3 and 4 are detailed diagrams illustrating the row selection unit 105 of FIG. 2.

Referring to FIGS. 2 to 4, the conventional NAND flash memory device includes global word lines GWL<0:127>, a voltage pump 101, a row decoder unit 103, a row selection unit 105, a block decoder unit 107, a block selection unit 109, and a cell array area 111. The cell array area 111 includes a plurality of memory blocks BLOCK_0 to BLOCK_n, and it is assumed that the number of word lines in one block is 128. Thus, the number of the global word lines GWL<0:127> is also 128.

The voltage pump 101 generates a plurality of voltages V<0:7> used for applying voltages at different levels to word lines in program and read operations and the like. It is assumed that the number of the different voltages generated by the voltage pump 101 is 8.

The row decoder unit 103 receives a row address RADD for each operation, and generates control signals SWCTRL3<0:127> for applying different voltages to a word line selected by the row address RADD, word lines employing the boosting operation, and remaining word lines.

Referring to FIG. 3, the selection unit 105 may include a plurality of switch units SW0 to SW127 for selecting one of the voltages V<0:7> generated by the voltage pump 101 and applying the selected voltage to the global word lines GWL<0> to GWL<127>. In detail, the switch units SW0 to SW127 select one of the eight voltages V<0> to V<7> in response to the control signals SWCTRL<0> to SWCTRL<127> generated by the row decoder unit 103 and apply the selected voltage to the global word lines GWL<0> to GWL<127>, which are connected to the switch units SW0 to SW127, respectively. Thus, each switch unit includes eight switches, and a control signal (for example, the control signal SWCTRL<0> input to the switch unit SW0) that controls each switch unit is represented by 3 bits or more.

The block decoder unit 107 receives a block address BLADD and generates block control signals BLCTRL<0:n> for selecting blocks corresponding to the block address BLADD, and the block selection unit 109 connects the blocks corresponding to the input block address BLADD to the global word lines GWL<0> to GWL<127> in response to the block control signals BLCTRL<0:n>. In this way, voltages applied to the global word lines GWL<0> to GWL<127> are transferred to word lines in the selected block.

However, referring to FIG. 4, one switch unit SW0 connected to one global word line GWL<0> includes eight switches that select one of the eight different voltages V<0> to V<7>. Therefore, the 128 switch units SW0 to SW127 connected to the 128 global word lines GWL<0:127> include 1024 (=128*8) switches, and control signals of 384 (=128*3) bits are implemented to control the switches. The number of the switches is increased as the number of word lines in one block is increased or the number of bias voltages is increased. Furthermore, if the number of the switches is increased, since the number of the control signals for controlling the switches is also increased, they occupy a large area in a memory device as the memory device is highly integrated with high capacity.

SUMMARY

An embodiment of the present invention is directed to a nonvolatile semiconductor device capable of reducing the overall circuit area by reducing the number of switches included for selectively applying a plurality of voltages to global word lines.

In accordance with an embodiment of the present invention, a nonvolatile memory device includes: a plurality of global word lines; a voltage pump configured to generate a plurality of voltages having different voltage levels; a control unit configured to divide the plurality of global word lines into a first group and a second group in response to an input row address and generate at least first, second, and third control signals for applying voltages corresponding to the first and second groups; a first selection unit configured to output at least two different voltages among the plurality of voltages generated by the voltage pump that are to be applied to global word lines of the first group, in response to the first control signals; a second selection unit configured to output a voltage among the plurality of voltages generated by the voltage pump that is to be applied to global word lines of the second group, in response to the second control signal; and a third selection unit configured to apply output voltages of the first selection unit to the global word lines of the first group, and apply an output voltage of the second selection unit to the global word lines of the second group in response to the third control signals.

The control unit may set global word lines of the plurality of global word lines that are spaced within a distance from a global word line corresponding to the input row address, as the first group, and set remaining global word lines as the second group.

In accordance with an embodiment of the present invention, a nonvolatile memory device includes: a voltage pump configured to generate a plurality of voltages having different voltage levels; N first switch units configured to select one of the plurality of voltages generated by the voltage pump and output a selected voltage as a first group voltage in response to an input row address; a second switch unit configured to select one of the plurality of voltages generated by the voltage pump and output a selected voltage as a second group voltage; a plurality of switch groups including N third switch units, respectively; and a plurality of global word lines connected to the third switch units, respectively, wherein the N third switch units included in each of the plurality of switch groups correspond to the N first switch units respectively, select either the first group voltage or the second group voltage in response to the input row address, and apply a selected voltage to connected global word lines.

In accordance with an embodiment of the present invention, A nonvolatile memory device comprising: a plurality of global word lines; a control unit configured to generate first to third control signals in response to an inputted row address; a first selection unit configured to select one or more voltages among a plurality of voltages of different levels and transfer the selected voltages to one or more first lines in response to the first control signal; a second selection signal configured to select one voltage among the multiple voltages in response to the second control signal; and a third selection unit configured to select one or more global word lines among the multiple global word lines and transfer voltages of the one or more first lines and transfer a voltage of the second line to global word lines other than the selected one or more global word lines in response to the third control signal.

DETAILED DESCRIPTION

Figure 1A:
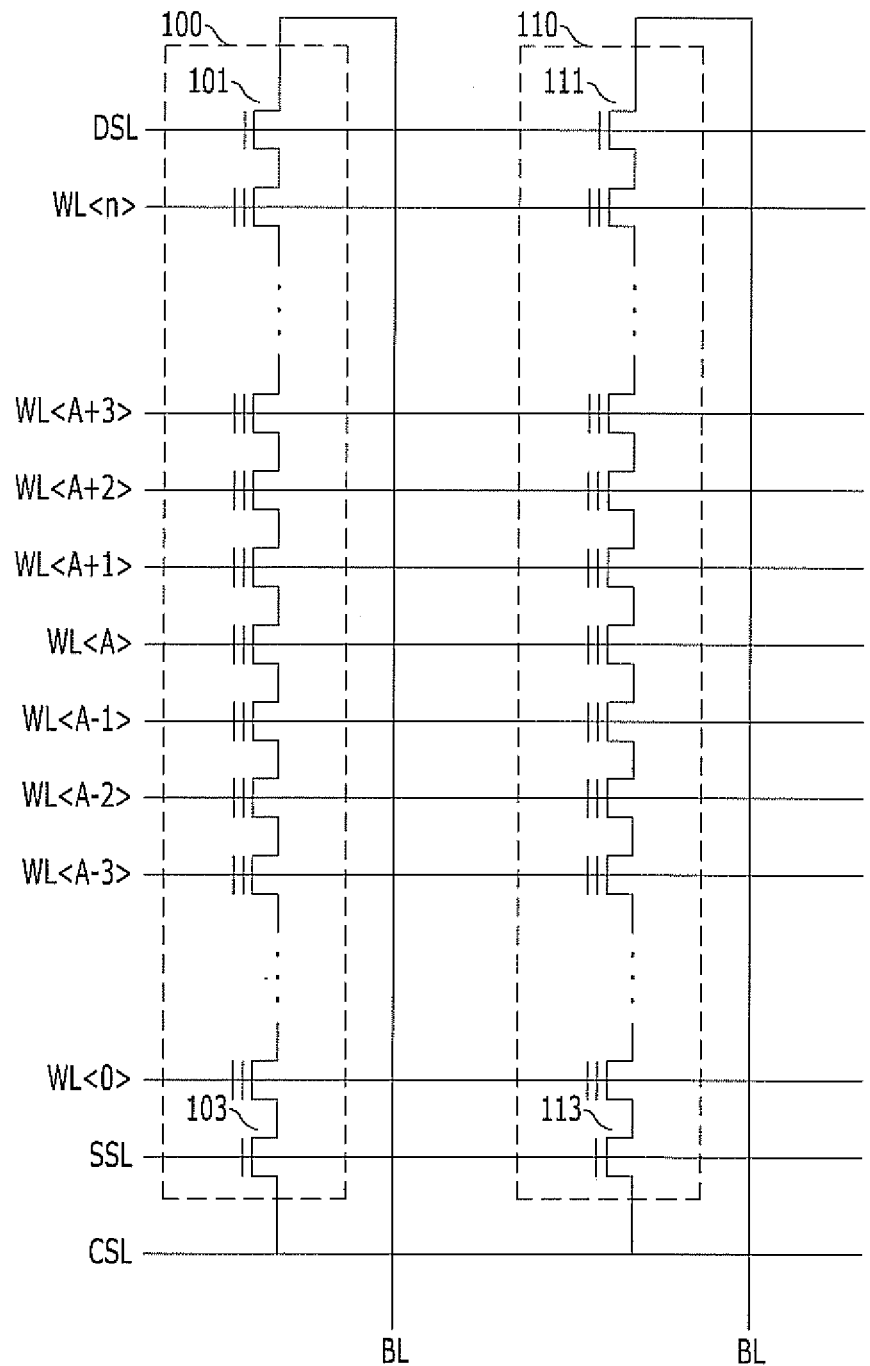
FIG. 1A is a diagram illustrating a part of a memory cell array of an NAND flash memory device.
Figure 1B:
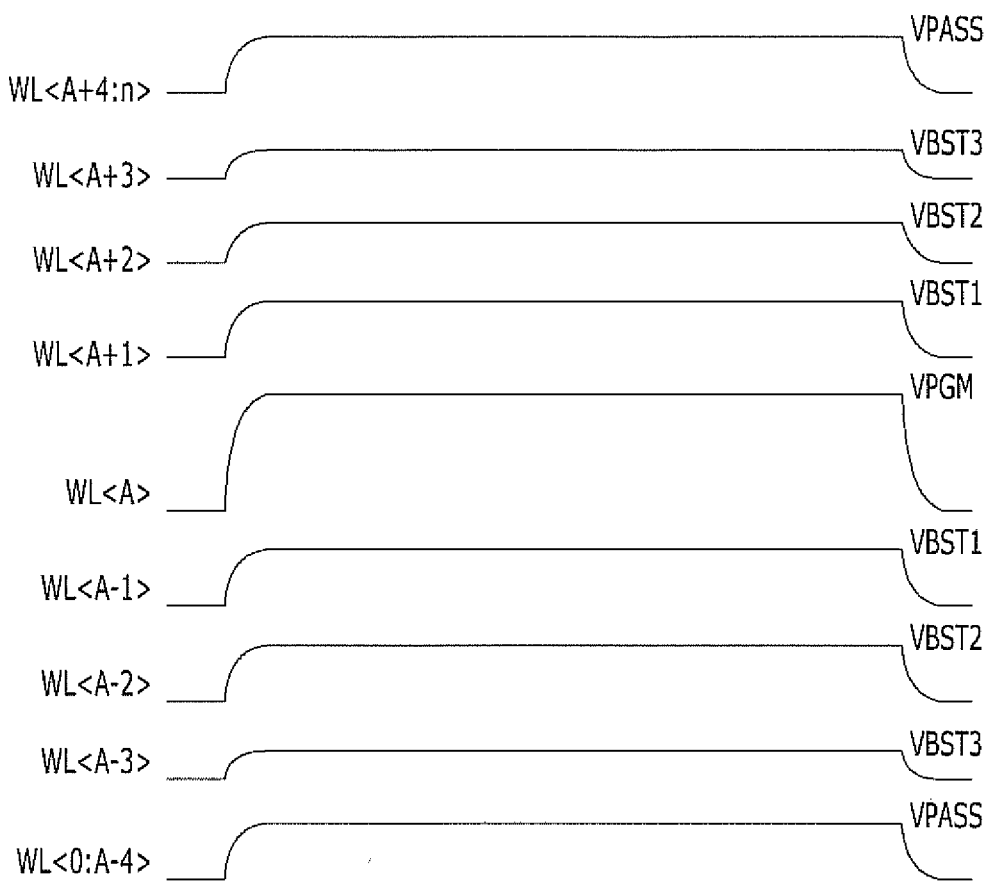
FIG. 1B is a diagram illustrating voltages applied to the word lines of FIG. 1A in a program operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
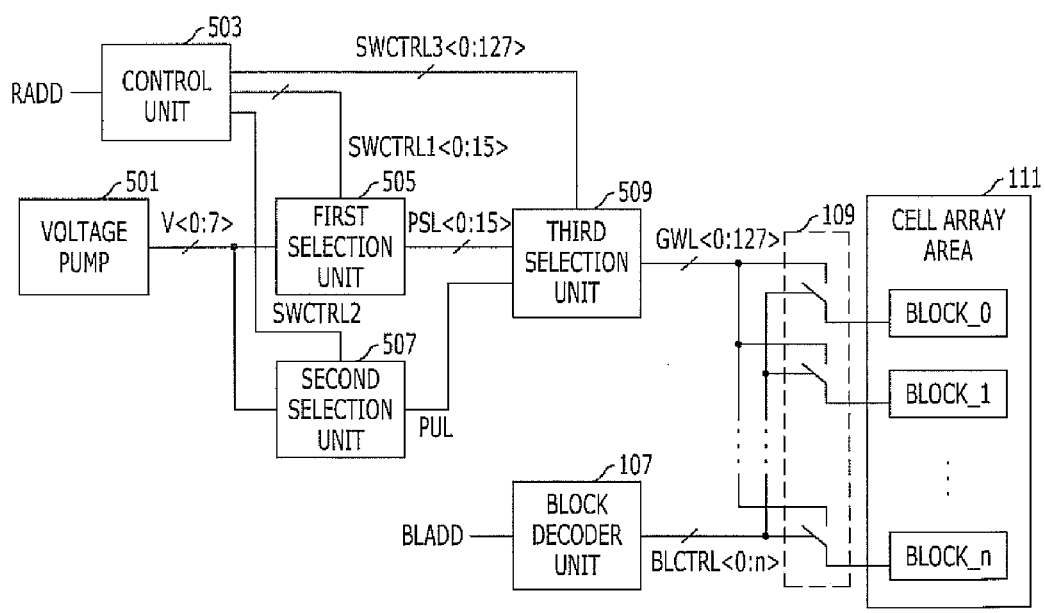
FIG. 5 is a configuration diagram of a nonvolatile semiconductor device in accordance with an embodiment of the present invention.

FIG. 5 is a configuration diagram of a nonvolatile semiconductor device in accordance with an embodiment of the present invention.

Referring to FIG. 5, the nonvolatile semiconductor device in accordance with the embodiment of the present invention includes a plurality of global word lines GWL<0:127>, a voltage pump 501 configured to generate a plurality of voltages V<0:7> at different voltage levels, a control unit 503, a first selection unit 505, a second selection unit 507, and a third selection unit 509. The control unit 503 is configured to divide the plurality of global word lines GWL<0:127> into a first group and a second group in response to an input row address RADD, and generate control signals SWCTRL1<0:15>, SWCTRL2, and SWCTRL3<0:127> that apply voltages corresponding to the groups. The first selection unit 505 is configured to output two or more different voltages, which are to be applied to global word lines of the first group (hereinafter, referred to as first group of global word lines), among the plurality of voltages V<0:7> generated by the voltage pump 501 in response to the control signals SWCTRL1<0:15>. The second selection unit 507 is configured to output one voltage, which is to be applied to global word lines of the second group (hereinafter, referred to as second group of global word lines), among the plurality of voltages V<0:7> in response to the control signal SWCTRL2. The third selection unit 509 is configured to apply the output voltage of the first selection unit 505 to the first group of global word lines and apply the output voltage of the second selection unit 507 to the second group of global word lines in response to the control signals SWCTRL3<0:127>.

Furthermore, the nonvolatile semiconductor device in accordance with the present embodiment may further include a block decoder unit 107, a block selection unit 109, and a cell array area 111. The block decoder unit 107 is configured to receive a block address BLADD and generate block control signals BLCTRL<0:n> that selects blocks corresponding to the block address BLADD. The block selection unit 109 is configured to connect the blocks corresponding to the input block address BLADD to the global word lines GWL<0> to GWL<127> in response to the block control signals BLCTRL<0:n>. The cell array area 111 includes a plurality of blocks BLOCK_0 to BLOCK_n.

Here, it is assumed that the number of word lines in one block is 128. Thus, the number of the global word lines GWL<0:127> is also 128. Furthermore, it is assumed that the voltage pump 501 generates eight voltages V<0:7> at different voltage levels. However, the number of word lines per one block and the number of the voltages generated by the voltage pump 501 may be changed according to different designs.

Figure 2:
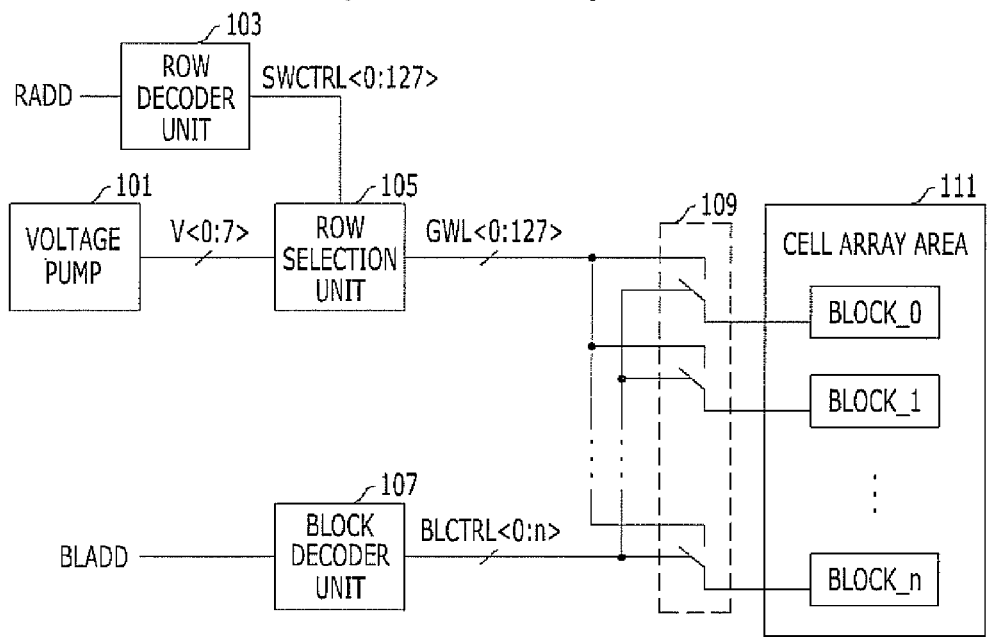
FIG. 2 is a diagram illustrating a word line control circuit of an NAND flash memory device according to the conventional art.

According to the conventional method (refer to FIG. 2) for applying voltages to the global word lines GWL<0:127>, a word line selected by an input row address RADD, word lines adjacent to the word line employing the boosting option, and remaining word lines are controlled with the same switch structure. More specifically, since eight switches that selectively apply one of the eight different voltages generated by the voltage pump 101 are connected to all the global word lines GWL<0:127> in sets, respectively, a large number of switches and control signals for controlling the switches are included as described above.

However, in the present invention, a two-stage switch structure is provided between the voltage pump 501 and the global word lines GWL<0:127> to reduce the total number of switches. In detail, by means of the first selection unit 505 and the second selection unit 507, all the global word lines GWL<0:127> are classified into a first group including a word line selected by the input row address RADD and word lines employing the boosting option and receiving different voltages, and a second group not employing the boosting option and receiving the same voltage. The third selection unit 509 is directly connected to the global word lines GWL<0:127> to apply a plurality of voltages output from the first selection unit 505 to the first group of global word lines while applying a voltage output from the second selection unit 507 to the second group of global word lines.

Figure 6:
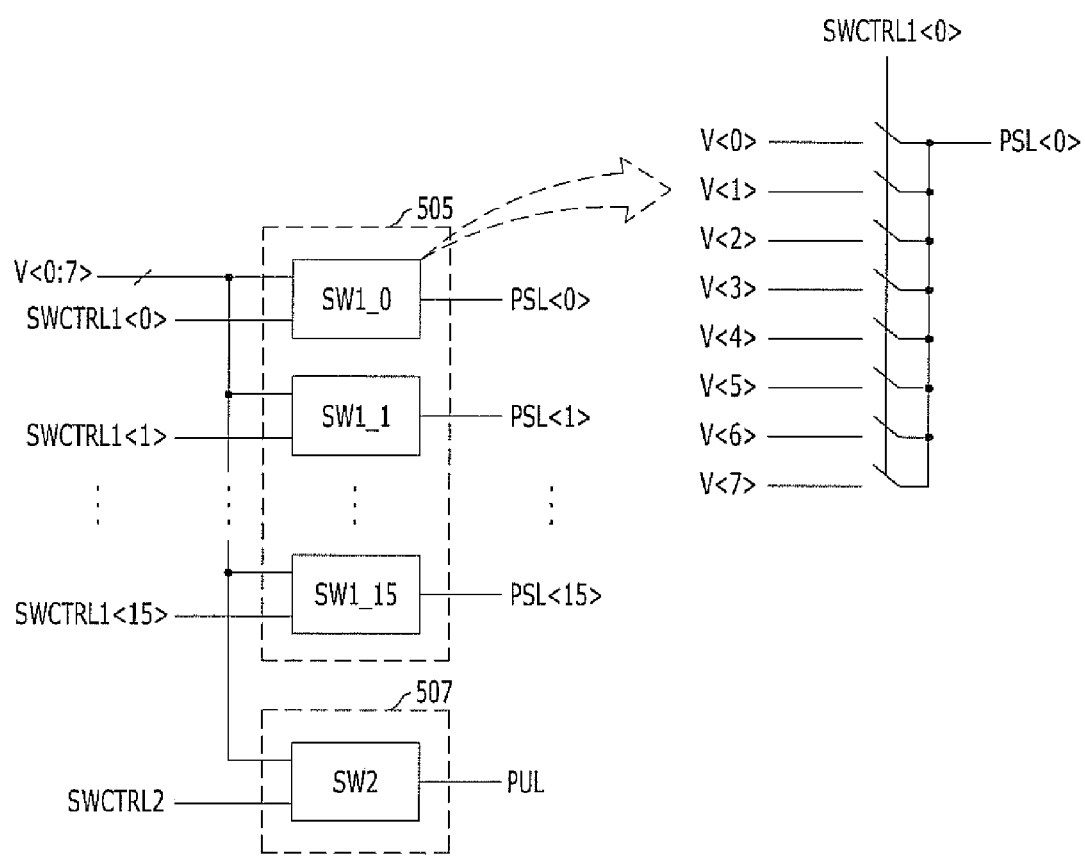
FIG. 6 is a detailed configuration diagram illustrating the first selection unit 505 and the second selection unit 507 of FIG. 5.
Figure 7:
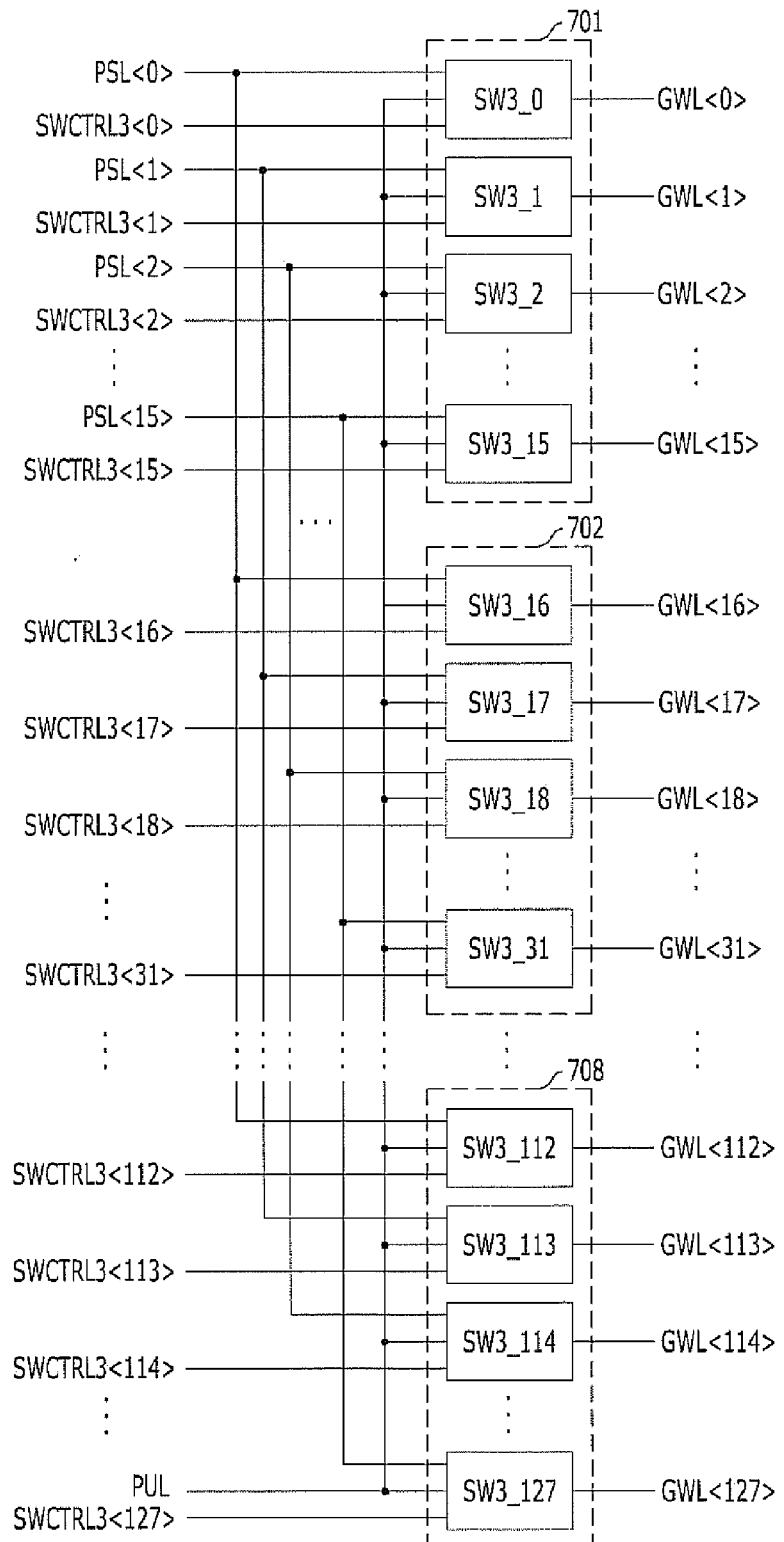
FIG. 7 is a detailed configuration diagram illustrating the third selection unit 509 of FIG. 5.

FIG. 6 is a detailed configuration diagram illustrating the first selection unit 505 and the second selection unit 507 of FIG. 5, and FIG. 7 is a detailed configuration diagram illustrating the third selection unit 509 of FIG. 5. With reference to FIGS. 6 and 7, the above-mentioned two-stage switch structure will be described in detail.

Referring to FIGS. 6 and 7, the first selection unit 505 includes a plurality of first switch units SW1_0 to SW1_15 that provide voltages to the first group of global word lines, and the second selection unit 507 includes a second switch unit SW2 that provides a voltage to the second group of global word lines. The third selection unit 509 includes a plurality of third switch units SW3_0 to SW3_127 connected to the global word lines GWL<0:127> to selectively apply one of the output voltages of the first switch units SW1_0 to SW1_15 or the output voltage of the second switch unit SW2 to the global word lines GWL<0:127>.

Here, it is assumed that, among all the 128 global word lines GWL<0:127>, the number of global word lines belonging to the first group is 16 and the remaining 112 global word lines belong to the second group. Thus, the first selection unit 505 includes the 16 first switch units SW1_0 to SW1_15 that output voltages to be applied to the first group of global word lines, and the output voltages of the switch units are transferred to the third selection unit 509 through 16 selection voltage lines PSL<0> to PSL<15>. However, the number of the word lines of the first group and the number of the switch units in the first selection unit 505 may be changed according to different designs.

The same voltage is applied to the remaining 112 second group global word lines, and the voltage output from the second switch unit SW2 is transferred to the third selection unit 509 through a non-selection voltage line PUL.

The control unit 503 generates the control signals SWCTRL1<0:15> that are applied to the first selection unit 505 and the control signal SWCTRL2 that is applied to the second selection unit 507 in response to the input row address RADD.

The plurality of first switch units SW1_0 to SW1_15 in the first selection unit 505 and the second switch unit SW2 in the second selection unit 507 receive the eight different voltages V<0> to V<7> generated by the voltage pump 501, and the first switch units SW1_0 to SW1_15 select one of the eight voltages V<0> to V<7> to output the selected voltage to the selection voltage lines PSL<0> to PSL<15> in response to the control signals SWCTRL1<0> to SWCTRL1<15>, respectively, and the second switch unit SW2 selects one of the eight voltages V<0> to V<7> to output the selected voltage to the non-selection voltage line PUL in response to the control signal SWCTRL2.

Referring to FIG. 6, the first switch units SW1_0 to SW1_15 and the second switch unit SW2 may include eight switches, respectively, and a control signal (for example, control signal SWCTRL1<0> input to the switch unit SW1_0) input to each switch unit may be represented by 3 bits at minimum to control the eight switches. The control method of the first switch units SW1_0 to SW1_15 and the second switch unit SW2 using the control signals SWCTRL1<0> to SWCTRL1<15> and SWCTRL2 will be described in detail with reference to FIG. 8.

Referring to FIG. 7, the third selection unit 509 includes 128 third switch units SW3_0 to SW3_127 connected to the 128 global word lines GWL<0:127>, respectively. The 128 third switch units SW3_0 to SW3_127 are classified into eight switch groups 701 to 708, and each of the eight switch groups 701 to 708 includes 16 third switch units SW3_0 to SW3_15, SW3_16 to SW3_31, and SW3_112 to SW3_127. The 16 third switch units SW3_0 to SW3_15, SW3_16 to SW3_31, and SW3_112 to SW3_127 in each of the eight switch groups 701 to 708 correspond to the 16 first switch units SW1_0 to SW1_15 of the first selection unit 505 in a one-to-one manner.

In detail, the output voltage of the first switch unit SW1_0 of the first selection unit 505 is input to the third switch units SW3_0, SW3_16, . . . , SW3_112 of the switch groups 701 to 708 through the first selection voltage line PSL<0>, and the output voltage of the first switch unit SW1_1 of the first selection unit 505 is input to the third switch units SW3_1, SW3_17, . . . , SW3_113 of the switch groups 701 to 708 through the second selection voltage line PSL<1>. More specifically, the selection voltage line PSL<0> is connected to the switch units SW3_0, SW3_16, SW3_32, . . . , SW3_112, the selection voltage line PSL<1> is connected to the switch units SW3_1, SW3_17, SW3_33, . . . , SW3_113, and the selection voltage line PSL<2> is connected to the switch units SW3_2, SW3_18, SW3_34, . . . , SW3_114 (the selection voltage lines PSL<3> to PSL<15> are connected in the same manner). The selection units 505 and 509 are connected to each other in such a manner that the first selection unit 505 is matched with the switch groups 701 to 708 of the third selection unit 509 in a one-to-one manner.

The output voltage of the second selection unit 507 is commonly input to the 128 third switch units SW3_0 to SW3_127 through the non-selection voltage line PUL. Thus, the third switch units SW3_0 to SW3_127 each receive two voltages: one of the output voltages of the first selection unit 505 and the output voltage of the second selection unit 507.

The control method of the third selection unit 509 will be described below. The control unit 503 generates the control signals SWCTRL3<0> to SWCTRL3<127> and inputs the control signals SWCTRL3<0> to SWCTRL3<127> to the third switch units SW3_0 to SW3_127 in response to the input row address RADD. Each of the control signals SWCTRL3<0> to SWCTRL3<127> may be a 1-bit signal having a logic 'high' or 'low' value.

The third switch units SW3_0 to SW3_127 select one of the two input voltages in response to the control signals SWCTRL3<0:127> and apply the selected voltage to the global word lines GWL<0:127> connected to the third switch units SW3_0 to SW3_127. The third switch units SW3_0 to SW3_127 select the output voltages of the first selection unit 505 when the applied control signals SWCTRL3<0> to SWCTRL3<127> have a 'high' value, and the third switch units SW3_0 to SW3_127 select the output voltage of the second selection unit 507 when the applied control signals SWCTRL3<0> to SWCTRL3<127> have a 'low' value. The selected output voltage is applied to the global word lines GWL<0:127> for each of the third switch units SW3_0 to SW3_127.

For example, when the global word line selected by the input row address RADD is GWL<10>, the control signals SWCTRL3<3> to SWCTRL3<18>, which are applied to the 16 third switch units SW3_3 to SW3_18 connected to the 16 global word lines GWL<3> to GWL<18> within a designated distance from the global word line GWL<10>, may have a 'high' value, and the remaining control signals SWCTRL3<0> to SWCTRL3<2>, SWCTRL3<19> to SWCTRL3<127> may have a 'low' value. Hereafter, the control operation of the third selection unit 509 will be described in further detail with reference to FIG. 8.

Figure 8:
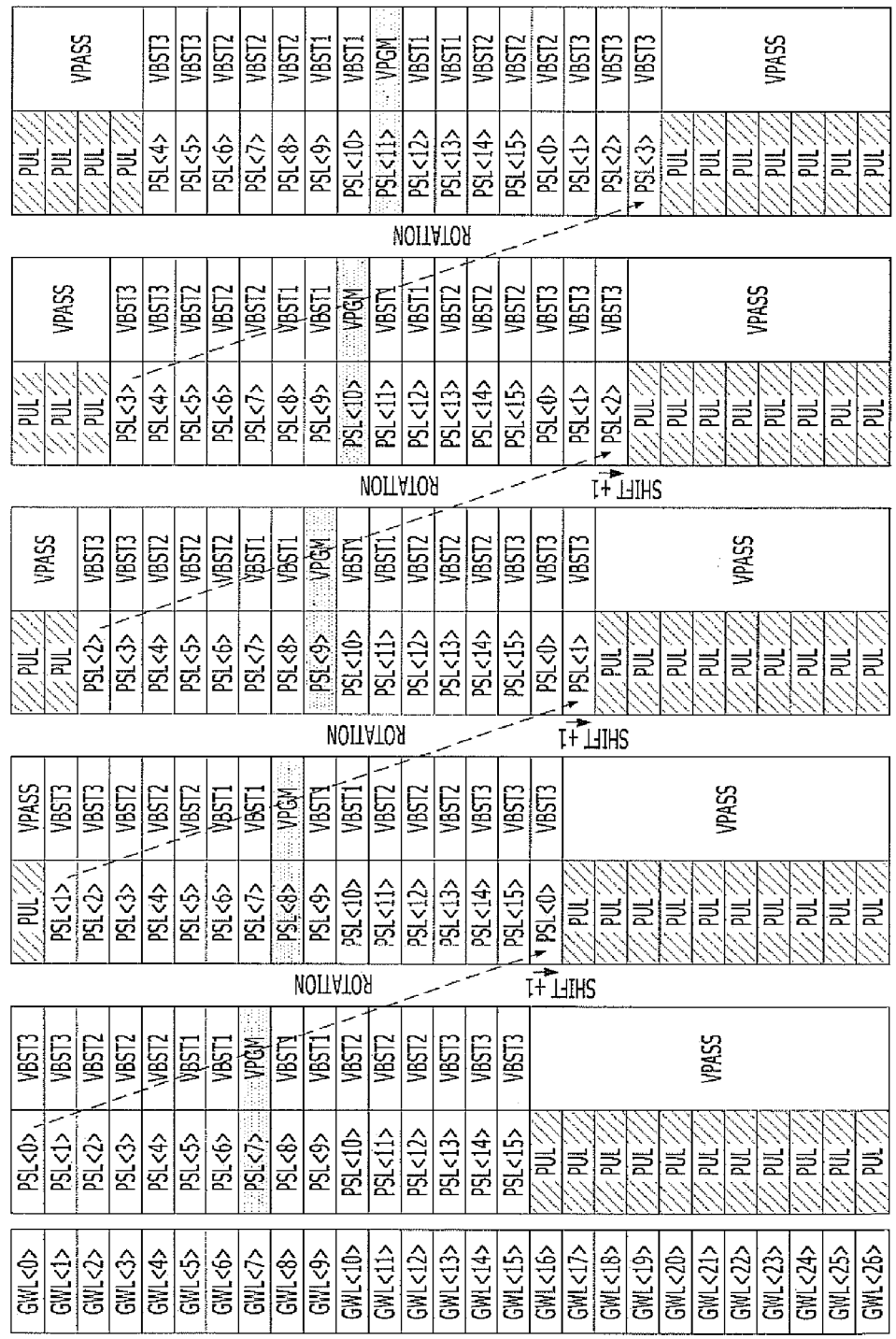
FIG. 8 is a diagram illustrating a voltage switching operation of a global word line in a program operation of a nonvolatile semiconductor device in accordance with the present invention.

FIG. 8 is a diagram illustrating a voltage switching operation of a global word line in the program operation of the nonvolatile semiconductor device in accordance with the present invention.

Referring to FIG. 8, when a global word line selected by the input row address RADD is GWL<7>, the global word lines GWL<0> to GWL<15> are respectively connected to the selection voltage lines PSL<0> to PSL<15> as a first group, and the remaining global word lines GWL<16> to GWL<127> are connected to the non-selection voltage line PUL as a second group.

At this time, the control signals SWCTRL1<0> to SWCTRL1<15> applied to the first switch units SW1_0 to SW1_15 are controlled such that the control signal SWCTRL1<7> selects a program voltage VPGM (for example, V<0>), the control signals SWCTRL1<5>, SWCTRL1<6>, SWCTRL1<8>, and SWCTRL1<9> select a first boosting voltage VBST1 (for example, V<1>), the control signals SWCTRL1<2>, SWCTRL1<3>, SWCTRL1<4>, SWCTRL1<10>, SWCTRL1<11>, and SWCTRL1<12> select a second boosting voltage VBST2 (for example, V<2>), and the control signals SWCTRL1<0>, SWCTRL1<1>, SWCTRL1<13>, SWCTRL1<14>, and SWCTRL1<15> select a third boosting voltage VBST3 (for example, V<3>). The control signal SWCTRL2 applied to the second switch unit SW2 is controlled to select a pass voltage VPASS (for example, V<4>). The control signals SWCTRL3<0> to SWCTRL3<127> applied to the third switch units SW3_0 to SW3_127 are controlled such that the control signals SWCTRL3<0> to SWCTRL3<15> select the output voltages PSL<0> to PSL<15> of the first switch units SW1_0 to SW1_15, and the control signals SWCTRL3<16> to SWCTRL3<127> select the output voltage PUL of the second switch unit SW2. Thus, the voltages of the selection voltage lines PSL<0> to PSL<15> are respectively applied to the global word lines GWL<0> to GWL<15>, and the voltage of the non-selection voltage line PUL is applied to the global word lines GWL<16> to GWL<127>.

When a global word line selected by the input row address RADD is GWL<8>, the global word lines GWL<1> to GWL<16> are respectively connected to the selection voltage lines PSL<1> to PSL<15> and PSL<0> as a first group, and the remaining global word lines GWL<0> and GWL<17> to GWL<127> are connected to the non-selection voltage line PUL as a second group.

At this time, the control signals SWCTRL1<0> to SWCTRL1<15> applied to the first switch units SW1_0 to SW1_15 are controlled such that the control signal SWCTRL1<8> selects the program voltage VPGM (for example, V<0>), the control signals SWCTRL1<6>, SWCTRL1<7>, SWCTRL1<9>, and SWCTRL1<10> select the first boosting voltage VBST1 (for example, V<1>), the control signals SWCTRL1<3>, SWCTRL1<4>, SWCTRL1<5>, SWCTRL1<11>, SWCTRL1<12>, and SWCTRL1<13> select the second boosting voltage VBST2 (for example, V<2>), and the control signals SWCTRL1<1>, SWCTRL1<2>, SWCTRL1<14>, SWCTRL1<15>, and SWCTRL1<0> select the third boosting voltage VBST3 (for example, V<3>). The control signal SWCTRL2 applied to the second switch unit SW2 is controlled to select the pass voltage VPASS (for example, V<4>). The control signals SWCTRL3<0> to SWCTRL3<127> applied to the third switch units SW3_0 to SW3_127 are controlled such that the control signals SWCTRL3<1> to SWCTRL3<16> sequentially select the output voltages PSL<1> to PSL<15>, and PSL<0> of the first switch units SW1_1 to SW1_15, and SW1_0, and the control signals SWCTRL3<0> and SWCTRL3<17> to SWCTRL3<127> select the output voltage PUL of the second switch unit SW2. Thus, the voltages of the selection voltage lines PSL<1> to PSL<15>, and PSL<0> are sequentially applied to the global word lines GWL<1> to GWL<16>, and the voltage of the non-selection voltage line PUL is applied to the global word lines GWL<0>, and GWL<16> to GWL<127>.

When a global word line selected by the input row address RADD is GWL<9>, the global word lines GWL<2> to GWL<17> are sequentially connected to the selection voltage lines PSL<2> to PSL<15>, PSL<0>, and PSL<1> as a first group, and the remaining global word lines GWL<0>, GWL<1>, and GWL<18> to GWL<127> are connected to the non-selection voltage line PUL as a second group.

At this time, the control signals SWCTRL1<0> to SWCTRL1<15> applied to the first switch units SW1_0 to SW1_15 are controlled such that the control signal SWCTRL1<9> selects the program voltage VPGM (for example, V<0>), the control signals SWCTRL1<7>, SWCTRL1<8>, SWCTRL1<10>, and SWCTRL1<11> select the first boosting voltage VBST1 (for example, V<1>), the control signals SWCTRL1<4>, SWCTRL1<5>, SWCTRL1<6>, SWCTRL1<12>, SWCTRL1<13>, and SWCTRL1<14> select the second boosting voltage VBST2 (for example, V<2>), and the control signals SWCTRL1<2>, SWCTRL1<3>, SWCTRL1<15>, SWCTRL1<0>, and SWCTRL1<1> select the third boosting voltage VBST3 (for example, V<3>). The control signal SWCTRL2 applied to the second switch unit SW2 is controlled to select the pass voltage VPASS (for example, V<4>). The control signals SWCTRL3<0> to SWCTRL3<127> applied to the third switch units SW3_0 to SW3_127 are controlled such that the control signals SWCTRL3<2> to SWCTRL3<17> sequentially select the output voltages PSL<2> to PSL<15>, PSL<0>, and PSL<1> of the first switch units SW1_2 to SW1_15, SW1_0, and SW1_1, and the control signals SWCTRL3<0>, SWCTRL3<1>, and SWCTRL3<18> to SWCTRL3<127> select the output voltage PUL of the second switch unit SW2. Thus, the voltages of the selection voltage lines PSL<2> to PSL<15>, PSL<0>, and PSL<1> are sequentially applied to the global word lines GWL<2> to GWL<17>, and the voltage of the non-selection voltage line PUL is applied to the global word lines GWL<0>, GWL<1>, and GWL<16> to GWL<127>.

In this way, the above-mentioned two-stage switch structure can be achieved in such a manner that whenever the input row address RADD is increased by 1, global word lines receiving the output voltages PSL<0> to PSL<15> of the first selection unit 505 are rotated one by one from the top to the bottom.

In such a case, in relation to the total number of switches included in the first to third selection units 505, 507, and 509, 128 (16*8) switches, 8 (1*8) switches, and 256 (128*2) switches are respectively included in the first to third selection units 505, 507, and 509, more specifically, only the total 392 switches are included. Furthermore, in relation to the total bit number of control signals for controlling the switches, 48 (16*3) bits, 3 (1*3) bits, and 128 (128*1) bits are respectively included in the first to third selection units 505, 507, and 509, more specifically, only the total 179 bits are included.

Figure 3:
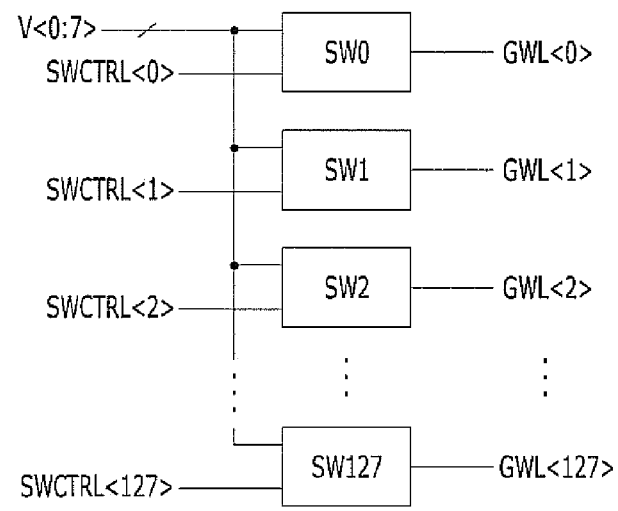
FIGS. 3 and 4 are detailed diagrams illustrating the row selection unit 105 of FIG. 2.
Figure 4:
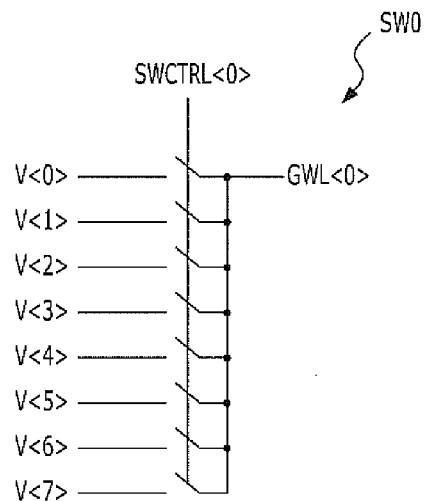

Consequently, as compared with the conventional art (referring to FIGS. 2 to 4, the total 1024 switches and the total 384 bits are included), since the same function can be performed using a significantly reduced number of switches and control signals, the area and complexity of the nonvolatile memory device may be reduced.

Referring back to FIGS. 5 to 7, a nonvolatile memory device in accordance with another embodiment of the present invention is described.

Referring to FIG. 5, the nonvolatile memory device includes a plurality of global word lines GWL<0:127>, a control unit 503, a first selection unit 505, a second selection unit 507, a third selection unit 509, and a voltage pump 501. The control unit 503 generates first to third control signals SWCTRL1<0:15>, SWCTRL2 and SWCTRL3<0:127> in response to an inputted row address RADD. The first selection unit 505 selects one or more voltages among multiple voltages V<0:7> having different levels and transfers the selected voltages to one or more first lines PSL<0:15> in response to the first control signal SWCTRL1<0:15>. The second selection unit 507 selects one voltage among the multiple voltages V<0:7> and transfers the selected voltage to a second line PUL in response to the second control signal SWCTRL2. The third selection unit 509 selects one or more global lines among the multiple global word lines GWL<0:127> and transfers a voltage of the one or more first lines PSL<0:15> in response to the third control signal SWCTRL3<0:127>, and transfers the voltage of the second line PUL to the global word lines other than the selected one or more global word lines. The voltage pump 501 generates the multiple voltages V<0:7>. Here, the first lines PSL<0:15> correspond to the aforementioned selection voltage lines PSL<0:15>, and the second line PUL corresponds to the aforementioned non-selection voltage line PUL.

Also, the nonvolatile memory device in accordance with the embodiment of the present invention may further include a block decoder unit 107, a block selection unit 109, and a cell array area 111. The block decoder unit 107 is configured to receive a block address BLADD and generate block control signals BLCTRL<0:n> that selects blocks corresponding to the block address BLADD. The block selection unit 109 is configured to connect the blocks corresponding to the input block address BLADD to the global word lines GWL<0> to GWL<127> in response to the block control signals BLCTRL<0:n>. The cell array area 111 includes a plurality of blocks BLOCK_0 to BLOCK_n.

Here, it is assumed that the number of word lines in one block is 128. Thus, the number of the global word lines GWL<0:127> is also 128. Also, it is assumed that the voltage pump 501 generates eight voltages V<0:7> at different voltage levels. However, the number of the word lines per block and the number of the voltages generated by the voltage pump 501 may be changed according to design.

In the embodiment of the present invention, a two-stage switch structure is provided between the voltage pump 501 and the global word lines GWL<0:127> to reduce the total number of switches. To be specific, the word line selected by an inputted row address RADD among the multiple global word lines GWL<0:127> and a boosting option are applied to the one or more first lines PSL<0:15>, and the first selection unit 505 transfers one or more voltages to be applied to the global word lines of different voltage levels. The second selection unit 507 transfers one voltage to be applied to the global word lines having the same voltage because no boosting option is applied among the multiple global word lines GWL<0:127> to the second line PUL.

Subsequently, the third selection unit 509 selects one or more global word lines to which the global word line corresponding to the inputted row address RADD and a boosting option are applied and transfers the voltages of the one or more first lines PSL<0:15>, and transfers the voltage of the second line PUL to the global word line other than the selected one or more global word lines.

Since one or more global word lines to which the boosting option is applied are global word lines that are closest to the global word line designated by the inputted row address RADD, the third selection unit 509 may select the global word line designated by the inputted row address RADD and the global word lines that are the global word line designated by the inputted row address RADD.

The first selection unit 505 includes one or more first switch units SW1_0 to SW1_15 that respectively correspond to the one or more first lines PSL<0:15>, and the second selection unit 507 includes a second switch unit SW2 for selecting one voltage among the multiple voltages V<0:7> and transferring it to the second line PUL. The third selection unit 509 includes a plurality of third switch units SW3_0 to SW3_127 that respectively correspond to the multiple global word lines GWL<0:127>.

Here, it is assumed that the number of global word lines selected by the third selection unit 509 among the 128 global word lines GWL<0:127> is 16, and the other 116 are unselected global word lines. Therefore, the first selection unit 505 includes 16 first switch units SW1_0 to SW1_15 that respectively correspond to the 16 first lines PSL<0:15> for transferring voltages to be applied to the 16 global word lines selected by the third selection unit 509, respectively.

The third selection unit 509 transfers voltages of the 16 first lines PSL<0:15> to the 16 global word lines selected among the global word lines GWL<0:127>. Here, the number of global word lines selected by the third selection unit 509 and the number of switch units inside the first selection unit 505 may be different according to design. An identical voltage is applied to the other 112 global word lines that are not selected by the third selection unit 509, and the voltage to be applied to the 112 global word lines is selected by the second switch units SW2 and transferred to the third selection unit 509 through the second line PUL.

The global word lines selected by the third selection unit 509 are global word lines employing the word line selected by the inputted row address RADD and a boosting option and having different voltages, and the global word lines that are not selected are global word lines that are not employing the boosting option and have the same voltage.

The control unit 503 generates the first control signals SWCTRL1<0:15> to be applied to the first selection unit 505, the second control signal SWCTRL2 to be applied to the second selection unit 507, and the third control signals SWCTRL3<0:127> to be applied to the third selection unit 509 in response to the inputted row address RADD.

Each of the one or more first switch units SW1_0 to SW1_15 included in the first selection unit 505 selects one voltage among 8 different voltages V<0:7> generated in the voltage pump 501 and transfers it to a first line corresponding thereto in response to the first control signals SWCTRL1<0:15>. Here, the voltage selected by the first switch unit is decided based on the distance between the first line corresponding thereto and a first line that is to transfer a voltage to a global word line designated by the inputted row address RADD.

To be more specific, each of the one or more first switch units SW1_0 to SW1_15 selects one among a program voltage VPGM and one or more boosting voltages VBST1 to VBST3 based on the distance between the first line corresponding thereto among one or more first lines PSL<0:15> and the first line that is to transfer a voltage to a global word line designated by the inputted row address RADD, and transfers it to the first line corresponding thereto.

For example, referring to FIG. 8, when a global word line GWL<7> is selected based on the row address RADD (see 801), the voltage selected by the first switch units becomes different according to the distance of the first line which transfers a voltage to the global word line GWL<7>, that is, the distance between the first line PSL<7> and the first line corresponding to each of the first switch units. The first switch units SW1_5, SW1_6, SW1_8, and SW1_9 select a first boosting voltage VBST1, e.g., V<1>, and the first switch units SW1_2, SW1_3, SW1_4, SW1_10, SW1_11, and SW1_12 select a second boosting voltage VBST2, e.g., V<2>, and the first switch units SW1_0, SW1_1, SW1_13, SW1_14, and SW1_15 select a third boosting voltage VBST3, e.g., V<3>, and transfer them to the corresponding first lines.

The second switch unit SW2 selects one voltage among the 8 different voltages V<0:7> that are generated in the voltage pump 501 and transfers it to the second line PUL in response to the second control signal SWCTRL2. Here, the voltage selected by the second switch unit SW2 is a voltage to be commonly applied to the global word lines other than the one or more global word lines that receive voltages through one or more first lines PSL<0:15> among the global word lines GWL<0:127>. For example, the second switch unit SW2 selects a pass voltage VPASS and transfers the pass voltage VPASS to the second line PUL.

Here, as illustrated in FIG. 6, the first switch units SW1_0 to SW1_15 and the second switch unit SW2 include 8 switches individually, and the control signal (for example, a control signal SWCTRL1<0> inputted to the first switch unit SW1_0) inputted to each switch unit may be formed of at least 3 bits to control the 8 switches. A method for controlling the first switch units SW1_0 to SW1_15 and the second switch unit SW2 based on the first and second control signals SWCTRL1<0:15> and SWCTRL2 is the same as described with reference to FIG. 8.

The third selection unit 509 includes 128 third switch units SW3_0 to SW3_127 that are coupled with the 128 global word lines GWL<0:127>, respectively. The 128 third switch units SW3_0 to SW3_127 are divided into 8 switch groups 701 to 708, and each of the 8 switch groups 701 to 708 includes 16 third switch units SW3_0 to SW3_15, SW3_16 to SW3_31, . . . , SW3_112 to SW3_127. The 16 third switch units SW3_0 to SW3_15, SW3_16 to SW3_31, . . . , SW3_112 to SW3_127 inside of each of the 8 switch groups 701 to 708 correspond to the 16 first switch units SW1_0 to SW1_15 of the first selection unit 505 in one-to-one.

To be specific, an output voltage of the first first switch unit SW1_0 of the first selection unit 505 is inputted to the first third switch units SW3_0, SW3_16, . . . , SW3_112 of each of the 8 switch groups 701 to 708 through the first selection voltage line PSL<0>, and an output voltage of the second first switch unit SW1_1 of the first selection unit 505 is inputted to the second third switch units SW3_1, SW3_17, . . . , SW3_113 of each of the 8 switch groups 701 to 708 through the second selection voltage line PSL<1>. In short, the first selection voltage line PSL<0> is coupled with the third switch units SW3_0, SW3_16, SW3_32, . . . , SW3_112; the second selection voltage line PSL<1> is coupled with the third switch units SW3_1, SW3_17, SW3_33, . . . , SW3_113; and the third selection voltage line PSL<2> is coupled with the third switch units SW3_2, SW3_18, SW3_34, . . . , SW3_114, and the first selection unit 505 and the third selection unit 509 are coupled in such a manner that the first switch units of the first selection unit 505 are matched to the switch groups 701 to 708 of the third selection unit 509 in one-to-one. Here, the fourth to 16$^{th}$ third selection voltage line PSL<2> to PSL<15> are coupled with the third switch units in the same manner.

An output voltage of the second selection unit 507 is commonly inputted to the 128 third switch units SW3_0 to SW3_127 through the second line PUL. Therefore, the third switch units SW3_0 to SW3_127 receives two voltages: one is a voltage of the first line corresponding thereto among one or more first lines PSL<0:15>, and the other is a voltage of the second line PUL.

To have a look at the control method of the third selection unit 509, the control unit 503 generates the third control signals SWCTRL3<0:127> that are respectively inputted to the 128 third switch units SW3_0 to SW3_127 in response to the inputted row address RADD. Herein, each of the third control signals SWCTRL3<0:127> may be a one-bit signal having a value of a logic high or low level.

The third switch units SW3_0 to SW3_127 select one between the two voltages that are inputted thereto and applies it to a global word lines GWL<0:127> corresponding thereto in response to the third control signals SWCTRL3<0:127>. Herein, the third switch units SW3_0 to SW3_127 may select the voltage of the first line corresponding thereto when the applied third control signals SWCTRL3<0:127> is in a logic high level, or the third switch units SW3_0 to SW3_127 may select the voltage of the second line when the applied third control signals SWCTRL3<0:127> is in a logic low level, and apply the selected voltage to the global word lines GWL<0:127> corresponding thereto.

For example, when a global word line GWL<10> is selected by the inputted row address RADD, the third control signals SWCTRL3<3> to SWCTRL3<18> that are applied to 16 third switch units SW3_3 to SW3_18 coupled with the 16 global word lines GWL<3> to GWL<18> within a predetermined distance from the global word line GWL<10> may have a value of logic high level, and the other third control signals SWCTRL3<0> to SWCTRL3<2> and SWCTRL3<19> to SWCTRL3<127> may have a value of logic low level. Detailed control operation is the same as described with reference to FIG. 8.

According to the present invention, a two-stage switch structure is provided between a voltage pump and global word lines to selectively apply a plurality of voltages to the global word lines. Through the embodiment of the present invention the number of switches included for an entire circuit and the number of control signals for controlling the switches is reduced. Consequently, the entire area and complexity of a highly integrated nonvolatile memory device is also reduced.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
a plurality of global word lines;
a voltage pump configured to generate a plurality of voltages having different voltage levels;
a control unit configured to divide the plurality of global word lines into a first group and a second group in response to an input row address and generate at least first, second, and third control signals for applying voltages corresponding to the first and second groups;
a first selection unit configured to output at least two different voltages among the plurality of voltages generated by the voltage pump that are to be applied to global word lines of the first group, in response to the first control signals;
a second selection unit configured to output a voltage among the plurality of voltages generated by the voltage pump that is to be applied to global word lines of the second group, in response to the second control signal; and
a third selection unit configured to receive output voltages of the first and second selection units, select and apply output voltages of the first selection unit to the global word lines of the first group, and select and apply an output voltage of the second selection unit to the global word lines of the second group in response to the third control signals.

2. The nonvolatile memory device of claim 1, wherein the control unit is configured to set global word lines of the plurality of global word lines that are closest to a global word line corresponding to the input row address and a global word line corresponding to the input row addresses the first group, and set remaining global word lines as the second group.

3. The nonvolatile memory device of claim 1, wherein the global word lines of the first group include a number of global word lines adjacent to a global word line corresponding to the input row address and a global word line corresponding to the input row address, and the global word lines of the second group include remaining global word lines except for the global word lines of the first group.

4. The nonvolatile memory device of claim 1, wherein the first selection unit comprises:
a plurality of first switch units corresponding to global word lines of the first group, respectively,
wherein each of the first switch units receives the plurality of voltages generated by the voltage pump and selects and outputs one of the plurality of voltages generated by the voltage pump according to a distance between a global word line corresponding to each first switch unit and a global word line selected by the input row address.

5. The nonvolatile memory device of claim 1, wherein the second selection unit comprises:
a second switch unit configured to receive the plurality of voltages generated by the voltage pump, and select and output one of the plurality of voltages that is to be commonly provided to the global word lines of the second group.

6. The nonvolatile memory device of claim 4, wherein the third selection unit comprises:
a plurality of third switch units connected to the plurality of global word lines, respectively,
wherein each of the third switch units receives one of the output voltages of the first selection unit and the output voltage of the second selection unit, and applies one of the two input voltages to a connected global word line in response to the third control signal.

7. The nonvolatile memory device of claim 6, wherein, when the number of the first switch units in the first selection unit is N, the third selection unit includes a plurality of switch groups including N third switch units, respectively, and the N third switch units in each switch group correspond to the N first switch units respectively.

8. The nonvolatile memory device of claim 1, wherein the first selection unit outputs at least two different voltages for applying pass voltages to neighboring word lines adjacent to the global word line selected by the input row address.

9. A nonvolatile memory device comprising:
a voltage pump configured to generate a plurality of voltages having different voltage levels;
N first switch units configured to select one of the plurality of voltages generated by the voltage pump and output a selected voltage as a first group voltage in response to an input row address;
a second switch unit configured to select one of the plurality of voltages generated by the voltage pump and output a selected voltage as a second group voltage;
a plurality of switch groups including N third switch units, respectively; and
a plurality of global word lines connected to the third switch units, respectively,
wherein the N third switch units included in each of the plurality of switch groups correspond to the N first switch units respectively, receive the first group voltage outputted from a corresponding first switch unit and the second group voltage outputted from the second switch unit, select either the first group voltage or the second group voltage in response to the input row address, and apply a selected voltage to connected global word lines.

10. The nonvolatile memory device of claim 9, wherein each of the N first switch units receives the plurality of voltages generated by the voltage pump, and selects and outputs one of the plurality of voltages generated by the voltage pump according to a distance between a global word line corresponding to each first switch unit and a global word line selected by the input row address.

11. The nonvolatile memory device of claim 9, wherein the second switch unit is configured to receive the plurality of voltages generated by the voltage pump, and configured to select and outputs one of the plurality of voltages that is to be commonly provided to global word lines of a second group.

12. The nonvolatile memory device of claim 9, wherein the N third switch units connected to N global word lines that are the N−1 closest global word lines to a global word line selected by the input row address and a global word line selected by the input row address select the first group voltage, and remaining third switch units select the second group voltage.

13. A nonvolatile memory device comprising:
a plurality of global word lines;
a control unit configured to generate first to third control signals in response to an inputted row address;
a first selection unit configured to select one or more voltages among a plurality of voltages of different levels and transfer the selected voltages to one or more first lines in response to the first control signal;
a second selection unit configured to select one voltage among the plurality of voltages and transfer the selected voltage to a second line in response to the second control signal; and
a third selection unit configured to receive a voltage of a corresponding first line and a voltage of second line, select one or more global word lines among the plurality of global word lines and transfer voltages of the corresponding first line and transfer the voltage of the second line to global word lines other than the selected one or more global word lines in response to the third control signal.

14. The nonvolatile memory device of claim 13, wherein the third selection unit selects a global word line corresponding to the inputted row address and global word lines that are closest to the global word line corresponding to the inputted row address.

15. The nonvolatile memory device of claim 13, wherein the first selection unit includes one or more first switch units that respectively correspond to the one or more first lines, and
each of the one or more first switch units selects one voltage among the plurality of voltages and transfers the selected voltage to a first line corresponding thereto according to a distance between the first line corresponding thereto and a first line which is to transfer a voltage to a global word line designated by the inputted row address.

16. The nonvolatile memory device of claim 15, wherein the second selection unit includes a second switch unit that selects one voltage among the plurality of voltages to the second line, and
the voltage selected by the second switch unit is commonly applied to global word lines except the one or more global word lines receiving voltages through the one or more first lines among the plurality of global word lines.

17. The nonvolatile memory device of claim 16, wherein the third selection unit includes a plurality of third switch units that respectively correspond to the plurality of global word lines, and
each of the third switch units transfers the voltage of the first line corresponding thereto or the voltage of the second line to a global word line corresponding thereto in response to the third control signal.

18. The nonvolatile memory device of claim 17, wherein when the number of the first switch units is N, the third switch units are divided into one or more switch groups each including N third switch units, and the N third switch units included in each switch group correspond to the N first switch units, respectively.

19. The nonvolatile memory device of claim 13, wherein the multiple voltage includes a program voltage, a pass voltage, and one or more boosting voltages, and each of the one or more first switch units selects one among the program voltage and the one or more boosting voltages, and transfers the selected voltage to the first line corresponding thereto, and the second switch unit selects the pass voltage and transfers the pass voltage to the second line.

20. The nonvolatile memory device of claim 13, further comprising:
a voltage pump configured to generate the plurality of voltages.

* * * * *